United States Patent
Chamberlin et al.

(10) Patent No.: US 7,109,722 B2
(45) Date of Patent: Sep. 19, 2006

(54) APPARATUS AND METHOD FOR PCB SMOKE AND BURN DETECTION AND PREVENTION

(75) Inventors: Bruce J. Chamberlin, Vestal, NY (US); Prabjit Singh, Poughkeepsie, NY (US); Timothy M. Trifilo, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 10/865,598

(22) Filed: Jun. 10, 2004

(65) Prior Publication Data

US 2005/0275552 A1 Dec. 15, 2005

(51) Int. Cl.
*H01H 31/12* (2006.01)

(52) U.S. Cl. .................. 324/551; 324/541; 340/647

(58) Field of Classification Search ............... 324/551
See application file for complete search history.

(56) References Cited

U.S. PATENT DOCUMENTS

| | | | |
|---|---|---|---|
| 3,596,264 A * | 7/1971 | Ciemochowski | 340/870.16 |
| 4,262,532 A | 4/1981 | Butler et al. | 73/345 |
| 4,567,428 A | 1/1986 | Zbinder | 324/73 PC |
| 5,623,594 A | 4/1997 | Swamy | 395/180 |

FOREIGN PATENT DOCUMENTS

| | | |
|---|---|---|
| JP | 3239973 A | 10/1991 |
| JP | 4099934 A | 3/1992 |
| JP | 4204063 A | 7/1992 |
| JP | 6196645 A | 7/1994 |
| JP | 9116268 A | 5/1997 |

OTHER PUBLICATIONS

P. Singh, J. R. Lloyd, S. Mazzuca, and T. Trifilo; "Preventing fire and smoke in power supplies".

* cited by examiner

*Primary Examiner*—Vincent Q. Nguyen
(74) *Attorney, Agent, or Firm*—Lily Neff; Cantor Colburn LLP

(57) ABSTRACT

An apparatus and method for at least one of detecting and preventing burning of a PCB is disclosed. The method includes configuring a first comb array defined by a plurality of first fingers at a first potential; configuring a second comb array defined by a plurality of second fingers at a second potential different from the first potential; interlacing the plurality of first fingers defining the first comb array with the plurality of second fingers defining the second comb array embedded in a substrate; disposing the substrate with the PCB; and detecting a rise in leakage current between the first and second comb arrays indicative of a breakdown of the substrate.

17 Claims, 3 Drawing Sheets

APPARATUS AND METHOD FOR PCB SMOKE AND BURN DETECTION AND PREVENTION

BACKGROUND OF THE INVENTION

The present disclosure relates generally to fault condition monitoring of printed circuit assemblies, such as those utilized within a digital computer, and specifically to the detection and prevention of the catastrophic failure of the dielectric in a multilayer printed circuit assembly, including smoke and burn detection and prevention.

Modern digital computers often use an array of multilayer printed circuit boards or assemblies to hold the digital logic components, interconnect them, and provide power to them. The amount of power used in such arrays of printed circuit assemblies is very high, on the order of tens of kilowatts. If a breakdown in the printed circuit dielectric between voltage and ground occurs, sufficient power is available to cause burning (carbonization) and potential fire on the failed printed circuit assembly. Such a catastrophic failure and fire may damage other closely spaced printed circuit assemblies.

The prior art burn detection method of smoke, or combustion product, detectors suffer from unreliability and a slow response time relative to the speed of the burn. Also previously utilized, overcurrent detection in power supplies is now insufficient to protect an individual printed circuit assembly. This is because the power supply may be outputting sufficient current to allow the catastrophic burn of an individual multilayer printed circuit assembly without such sufficient excess, or overcurrent as may be detected and utilized to protect such assembly. Finally, it would be possible to fuse each individual printed circuit assembly but such fusing is often inefficient or impractical. Fuses have a voltage drop and interfere with regulation of the direct current (DC) voltage source. Fuses are physically large for the currents involved, approximately 100 amperes, and do not fit on a printed circuit board. Furthermore, if an individual printed circuit card assembly is fused at full circuit current, a burn may still occur and not blow the fuse.

One solution to the above problem includes disposing two planes of parallel copper planes separated by a thin ply of epoxy and fiberglass (e.g., prepeg) across the PCB to detect leakage current. However, this solution requires an active or power plane to be disposed very close to the sense plane increasing the risk of the power plane shorting to the sense plane. Moreover, this solution does not support ball grid array (BGA) and land grid array (LGA) technologies.

Accordingly, an improved smoke and burn detection and prevention method and apparatus is desired that supports BGA/LGA technologies.

SUMMARY OF THE INVENTION

One embodiment is a method for at least one of detecting and preventing burning of a PCB is disclosed. The method comprises configuring a first comb array defined by a plurality of first fingers at a first potential; configuring a second comb array defined by a plurality of second fingers at a second potential different from the first potential; interlacing the plurality of first fingers defining the first comb array with the plurality of second fingers defining the second comb array embedded in a substrate; disposing the substrate with the PCB; and detecting a rise in leakage current between the first and second comb arrays indicative of a breakdown of the substrate.

In another embodiment, an apparatus for at least one of detecting and preventing burning of a PCB is disclosed. The apparatus includes a first comb array defined by a plurality of first fingers at a first potential; a second comb array defined by a plurality of second fingers at a second potential different from the first potential, the plurality of first fingers defining the first comb array interlaced with the plurality of second fingers defining the second comb array embedded in a substrate; a PCB disposed with the substrate to detect a rise in leakage current between the first and second comb arrays indicative of a breakdown of the substrate.

BRIEF DESCRIPTION OF THE DRAWINGS

Referring to the exemplary drawings wherein like elements are numbered alike in the accompanying Figures.

DETAILED DESCRIPTION OF THE INVENTION

Embodiments of the invention provide faster detection and improved sensitivity in detecting and preventing a burning PCB, as well as making it easier and more convenient to add a sensing plane to a PCB. Currently, multiple planes are distributed about the PCB to afford such detection and make it necessary to place an active plane needlessly close to a sense plane, thus risking power plane shorting to the sense plane. Embodiments of the invention eliminate concern for power plane shorting by eliminating a need to control a thickness of insulation between the multiple planes to prevent such shorting. Embodiments of the invention involve controlling a space between traces on a single plane with greater precision than a thickness between planes across a PCB.

In the past, fire detection in multilayer printed circuit assemblies had been done with smoke detectors which were unreliable, or with the detection of over current within power supplies. Modern digital computers often utilize an array of multilayer printed circuit assemblies to hold the circuit components, interconnect them, and provide power to them at high densities and close conductor spacings. The amount of power utilized in such new arrays of multilayer printed circuit assemblies is very high, and it has been found that if a breakdown in the dielectric between a voltage and ground occurs, sufficient power is available to cause the catastrophic dielectric breakdown and a potential fire upon the failing multilayer printed circuit assembly. Individual circuit fusing of the multilayer printed circuit assemblies is not feasible, so the apparatus of the present disclosure provides a means of detecting this dielectric failure and ensuing burn before it can cause severe damage to other circuit assemblies, property and personnel. The method of the present disclosure utilizes a separate, isolated, sensing layer having coplanar interlaced copper traces, inside the multilayer structure of the multilayer printed circuit assembly. When these normally isolated interlaced copper traces layer shows a lower resistance due to an increase in leakage current therebetween, indicating a breakdown of the dielectric, a failure has been found and the power can be turned off in an orderly manner prior to the development of a further, catastrophic, burn. Fire and smoke occurrences can thus be prevented and in the case of computer hardware, loss of data can be avoided.

Figure 1:
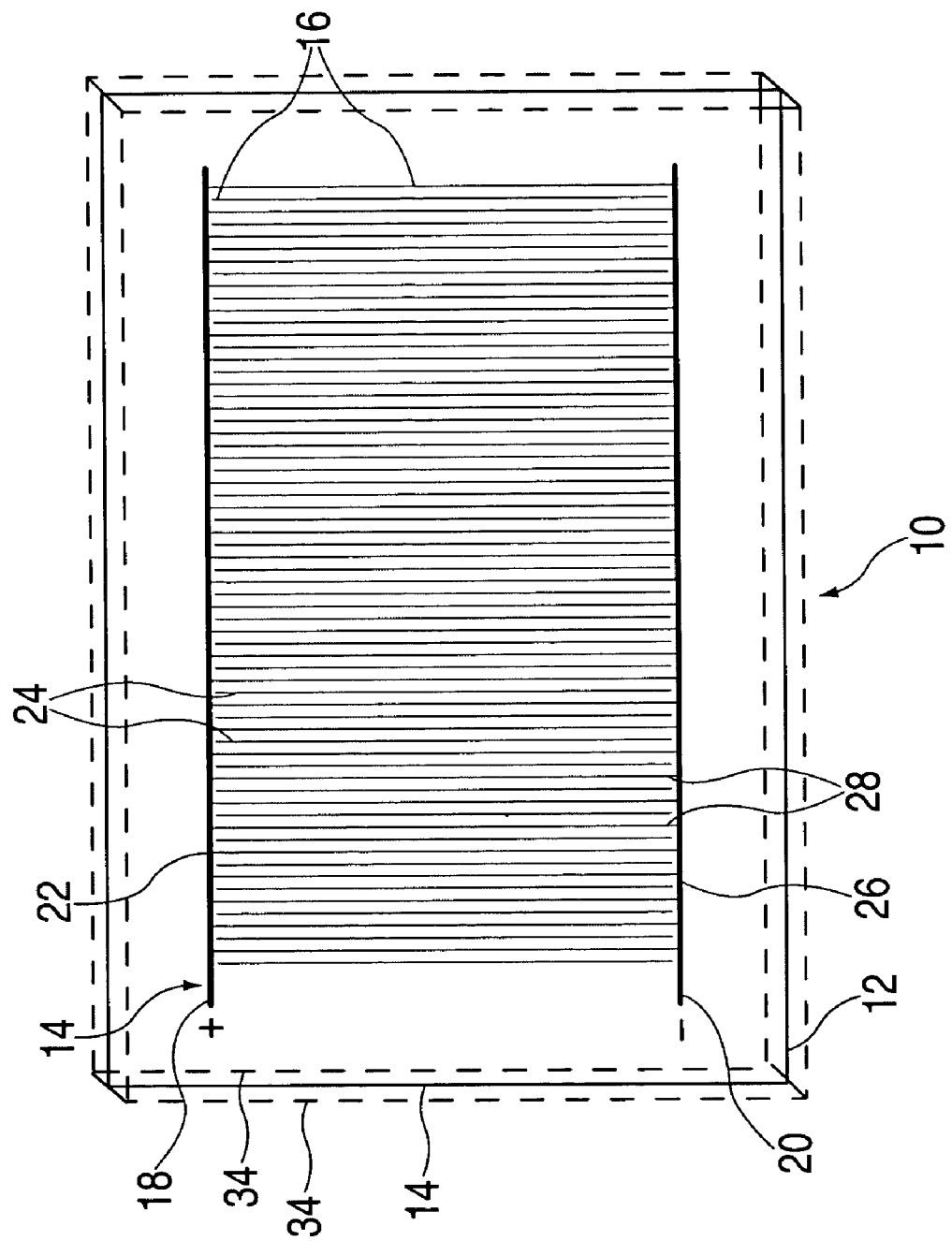
FIG. 1 depicts a top plan view of a sensing plane for detecting and prevention of smoking and burning of a PCB in an embodiment of the invention.

FIG. 1 is a top plan view of a sensing plane 10 in accordance with an exemplary embodiment. Sensing plane 10 includes a substantially flat substrate 12 having a sensing element 14 embedded therein. Substrate 12 is a dielectric layer of a multilayer printed circuit board (PCB) (not shown) upon which it is aligned to detect and prevent burning thereof, discussed more fully with reference to FIG. 2. Sensing element 14 includes at least two separate traces or comb arrays 16 each at different potentials. In an exemplary embodiment reflected in FIG. 1, a first trace 18 is at a first potential corresponding to a positive voltage while a second trace 20 is at a second potential corresponding to ground. However, other combinations of different potentials are contemplated suitable to the desired end purpose. First trace 18 is further defined having a first main trace 22 extending along a length defining substrate 12 having a plurality of spaced apart first branch traces 24 extending therefrom toward second trace 20 in a direction substantially normal to main trace 22. Second trace 20 is further defined having a second main trace 26 extending along a length defining substrate 12 substantially parallel to first main trace 22. Second main trace 26 includes a plurality of spaced apart second branch traces 28 extending therefrom toward first trace 18 in a direction substantially normal to second main trace 26.

The plurality of first and second branch traces are interlaced with each other such that contiguous first branch traces 24 have one second branch trace 28 therebetween. Likewise, contiguous second branch traces 28 have one first branch trace 24 therebetween. Spacing between first and second branch traces is arbitrary, and it is envisioned that spacing can be as little as 0.003 inch for a can be realized in modern printed circuit board fabrication techniques or similar PCB 30. Further, it should be noted that a copper weight for this sensing plane layer is arbitrary, but should be as thin as possible to optimize yield.

Figure 2:
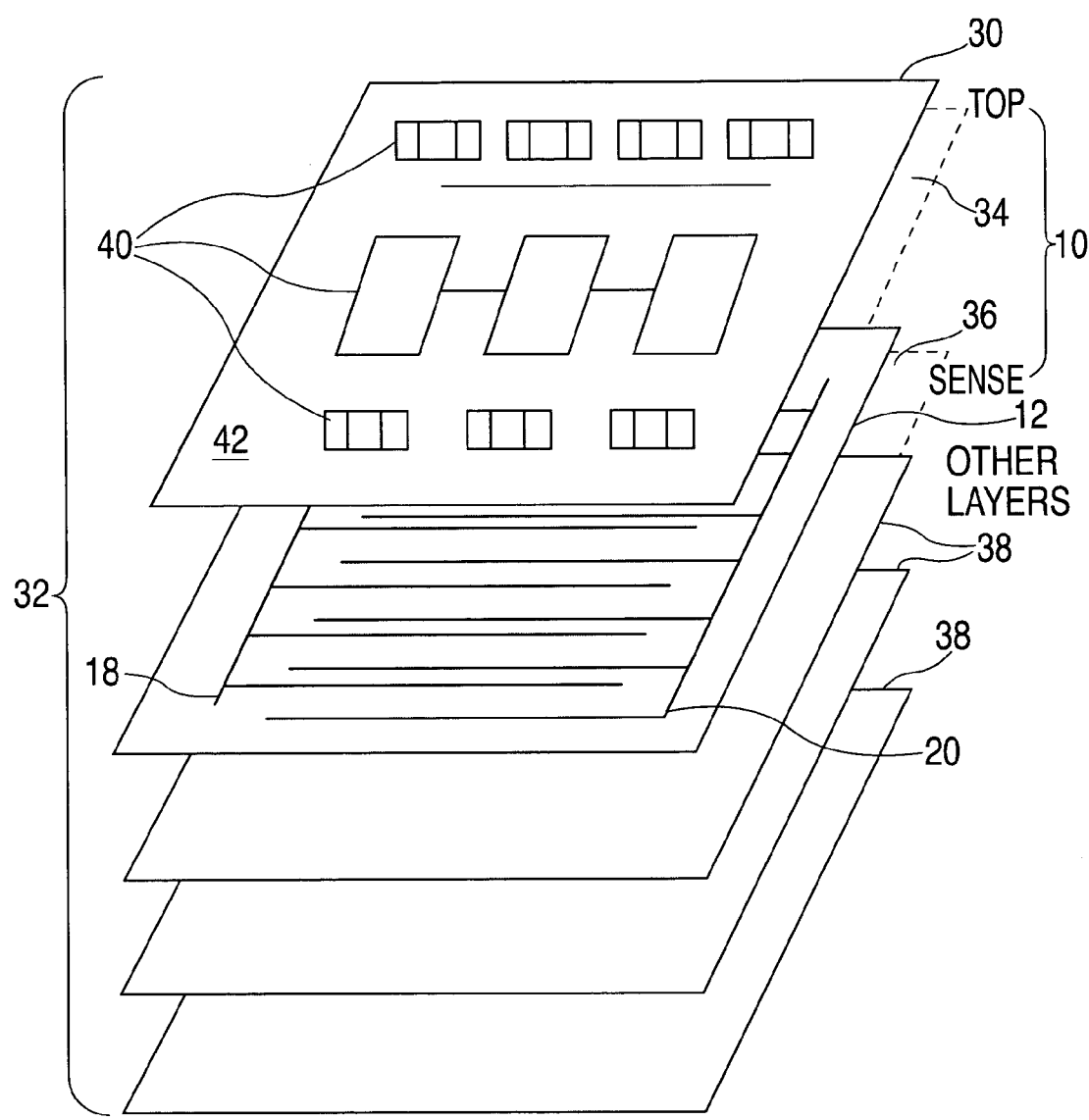
FIG. 2 is a perspective view of the sensing plane of FIG. 1 employed with a PCB disposed above and a layer of prepeg insulation therebetween shown in phantom in an embodiment of the invention.

Referring now to FIG. 2, sensing plane 10 of FIG. 1 is shown disposed under a PCB 30 in a multilayer PCB assembly 32 shown in exploded view. Sensing plane 10 disposed under PCB 30 includes an upper insulation layer 34 therebetween (shown with phantom lines) and a second layer or lower insulation layer 36 disposed on an opposite side defining sensing plane 10 for insulation from other layers 38 of multilayer PCB assembly 32.

More specifically, sensing element 14 is insulated from PCB 30 and other layers 38 using upper and lower insulation layers 34, 36 each comprised of a thin ply of epoxy and fiberglass. Furthermore, this same combination of epoxy and fiberglass fills the spacing between traces 18 and 20 of sensing element 14.

PCB 30 includes any number of electronic devices 40 operably connected to a top surface 42 defining PCB 30 as illustrated. It will be recognized that devices 40 are optionally in operable communication with each other and with other devices (not shown) on layers 38.

The sensing element 14 is disposed relative to sensing plane 12 in a manner to maximize monitoring as much of an area defining PCB 30 as is possible. Alternatively, sensing element may be disposed relative to an area defining sensing plane 12 only in the areas where PCB 30 has some probability of deterioration due to high imposed electric fields. In an exemplary embodiment, sensing plane 10 is disposed under a top signal layer.

It will be noted that vias, voids, and grid arrays pose a problem for the interlaced pattern of the first and second branch traces described above, however, it is contemplated that patterns may be formulated to accommodate such structures. For example, it is envisioned that teaching printed wiring board design software to make these kinds of patterns in accordance with design rules should be easily facilitated. (See FIGS. 3 and 4). In particular, Allegro can be easily taught to route traces 14 around thermal vias on power semiconductors that use copper on card as a heat sink.

Still referring to FIG. 2, a low voltage, of the order of about 1 volt (V), is applied between traces 18 and 20 and a leakage current therebetween is measured. If the leakage current goes above a predetermined value, power to PCB 30 is turned off, preventing PCB 30 from burning up.

The method is based on the principle that epoxies, like most polymers, contain low concentrations of ionic impurities, introduced during their manufacture, that drift under the influence of an electric field. At low temperatures, the space between the long-chain polymer molecules is relatively narrow, resulting in a lower diffusion coefficient and therefore lower mobility of the drifting ions. At higher temperatures, especially above the glass transition temperature $T_g$, the space between the long chain polymer molecules enlarges, resulting in higher diffusion coefficient and therefore higher mobility of the drifting ions. The conductivity of an epoxy, being limited by the mobility of the drifting ions, is a strong function of the epoxy temperature. A relationship between a epoxy leakage current and temperature allows a temperature of a PCB to be monitored by measuring the leakage current between coplanar interlaced copper traces 18 and 20 separated by a thin ply of epoxy and fiber glass. It will be noted that the above the feasibility of the proposed method has been proven for PCBs made of low and high $T_g$ FR-4 and BT epoxies.

The current limit above which the power to PCB 30 should be removed is determined as described herein below. A known good circuit board or assembly 32 with no known defects is placed in a temperature-humidity controlled chamber and powered on. The temperature and humidity are raised to the maximum values allowed by the environmental specification document for the product the assembly will be used in and allowed to stabilize in this environment for more than a day. A predetermined voltage, of about 1 volt (V), for example, but not limited thereto, is applied to traces 18 and 20 on sensing plane 10. A leakage current is then measured between trace 18 and trace 20. The resulting current measurement is the expected leakage current for a good, defect free PCB 30. The threshold leakage current above which the board should be powered off to avoid board burn is optionally set at about 10 times the leakage current measured for a good, defect free board, but is not limited thereto. The leakage current may also be inputted into a system administrator that monitors the overall state of the system in which assembly 32 is implemented. A rise in leakage current, or alternatively, a lowering of resistance, can also be used to indicate an impending deteriorating state of PCB 30 that may warrant taking preventive maintenance action to prevent eventual burning of PCB 30.

It will be noted that although the "comb array" described above with respect to the separated trace configurations of first and second traces 18, 20 may be more susceptible to receive signals with wavelengths that are integer multiples or divisors of the comb element length or traces 24 and 28. These signals can be filtered out easily enough as understood and recognized by one skilled in the pertinent art.

Figure 3:
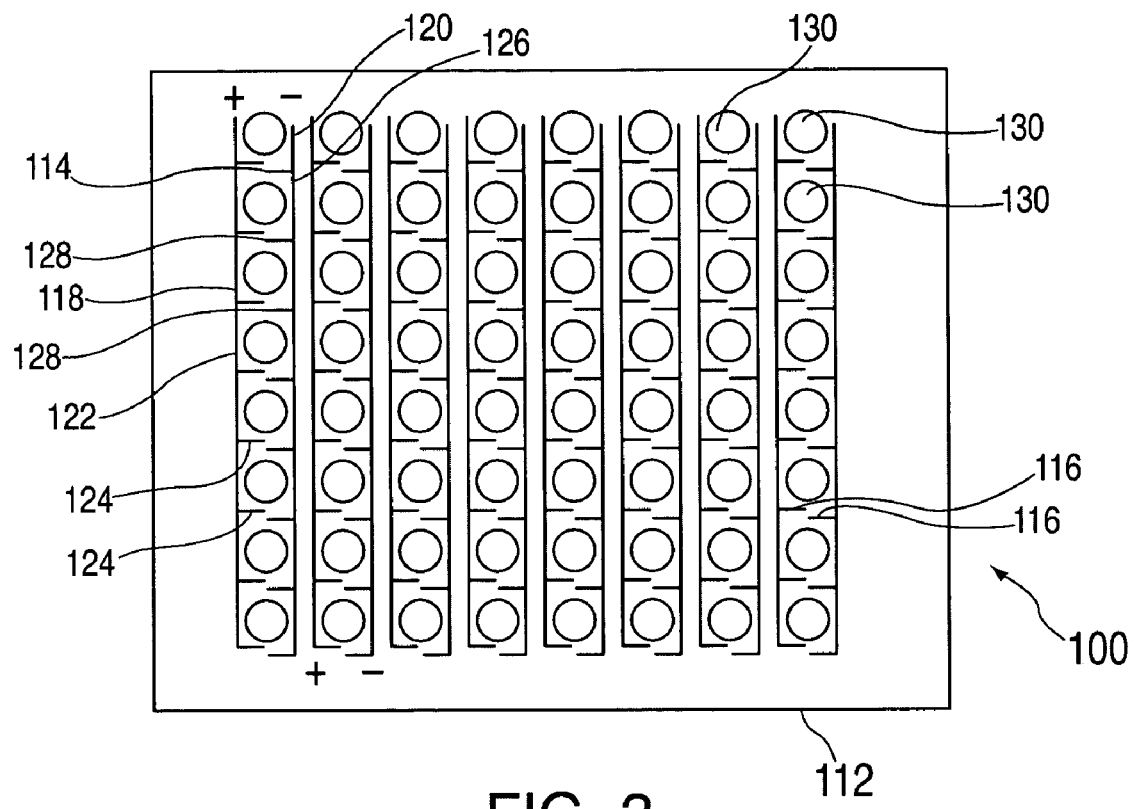
FIG. 3 depicts a top plan view of a sensing plane configuration for detecting and prevention of smoking and burning of a BGA in an alternative embodiment of the invention.

Referring now to FIG. 3, an alternative exemplary embodiment of a sensing plane 100 is illustrated. Sensing plane 100 includes a substantially flat substrate 112 having a sensing element 114 embedded therein. Substrate 112 is a dielectric layer of a multilayer printed circuit board (PCB) (not shown) upon which it is aligned to detect and prevent burning thereof, discussed more fully above with reference to FIG. 2. Sensing element 114 includes at least two separate traces 116 at different potentials. In an exemplary embodiment reflected in FIG. 3, a plurality of first traces 118 are each at a first potential corresponding to a positive voltage while a plurality of second traces 120 are each at a second potential corresponding to ground. However, other combinations of different potentials are contemplated suitable to the desired end purpose. Each first trace 118 is further defined having a first main trace 122 extending along a vertical length as illustrated defining substrate 112 having a plurality of spaced apart first branch traces 124 extending therefrom toward a corresponding second trace 120 in a direction substantially normal to main trace 122. Each second trace 120 is further defined having a second main trace 126 extending along the vertical length as illustrated defining substrate 112 substantially parallel to a corresponding first main trace 122, as illustrated. Each second main trace 126 includes a plurality of spaced apart second branch traces 128 extending therefrom toward a corresponding first trace 118 in a direction substantially normal to second main trace 126.

The plurality of first and second branch traces 124, 128 are interlaced with each other as described with reference to FIG. 1, however, contiguous pairs of interlaced branch traces 124 and 128 have a BGA conductive pad 130 therebetween for a conductive ball (not shown) to be attached thereto. Furthermore, it will be recognized that each column of a BGA includes two separate traces 116 at different potentials. Thus, the 8×8 BGA pattern of FIG. 3 includes eight pairs of traces 116, each pair of traces 116 including trace 118 at one potential interlaced with trace 120 at a different potential to sense leakage current therebetween.

Figure 4:
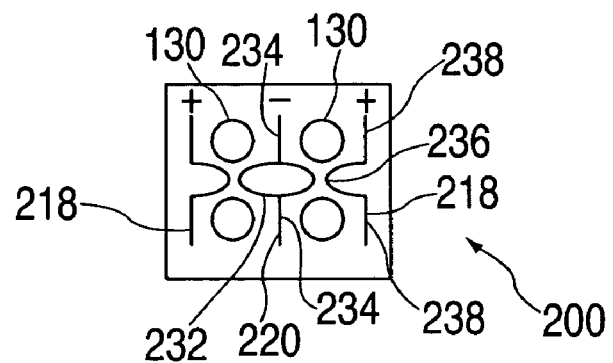
FIG. 4 depicts a top plan view of another sensing plane configuration for detecting and prevention of smoking and burning of a BGA in alternative embodiment of FIG. 3.

Referring now to FIG. 4, an alternative embodiment of the trace pattern of FIG. 3 for a BGA is illustrated. FIG. 4 illustrates a sensing plane 200 for a 2×2 BGA. The 2×2 BGA includes two columns of a pair of pads 130 in each column defining the 2×2 BGA that share a trace 220 therebetween having a first potential. Separate traces 218 at a second potential different from the first potential are disposed on opposing sides defining the 2×2 BGA. Instead of interlacing first and second traces described above with reference to FIG. 3, trace 220 between the two columns of pads 130 is further defined having an oval trace 232 intermediate four pads 130 of the 2×2 BGA and intermediate end traces 234 defining ends of trace 220. In like manner, each trace 218 on opposing sides of the 2×2 BGA defined by four pads 130 is further defined having a parabola or U-shaped trace 236 extending toward a space between a pair of pads 130 in each column, where each U-shaped trace extends from intermediate end traces 238 defining ends of a respective trace 218. An additional advantage of the above described configuration allows routing of traces lines around thermal vias on power semiconductors that are using copper on card as a heat sink.

The above described method and apparatus offers improved sensitivity in high density grids such as BGAs. Detecting a fault under a BGA or LGA is particularly of interest, and also somewhat difficult as the voiding pattern of various planes under a BGA vary by design. The above described embodiments allow disposal of a standard pattern on a PCB, regardless of BGA pinout configuration. The value gained by the above described embodiments lies not only in saving a board and its associated hardware from burning, but also by limiting damage to the board and allowing for a more fruitful root cause analysis to be done.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention is not to be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A method for at least one of detecting and preventing burning of a PCB, the method comprising:
    configuring a first comb array defined by a plurality of first fingers at a first potential;
    configuring a second comb array defined by a plurality of second fingers at a second potential different from said first potential;
    interlacing said plurality of first fingers defining said first comb array with said plurality of second fingers defining said second comb array embedded in a substrate;
    disposing said substrate with the PCB; and
    detecting a rise in leakage current between said first and second comb arrays indicative of a breakdown of said substrate,
    wherein said interlacing of said first and second comb arrays is coplanar and includes a layer of epoxy and fiberglass above and below a sensing element defined by said first and second comb arrays arranged in a sensing plane.

2. The method of claim 1 wherein:
    said substrate is an epoxy.

3. The method of claim 1 wherein:
    said sensing element is disposed relative to said sensing plane in a manner to maximize monitoring as much of an area defining the PCB as is possible.

4. The method of claim 1 wherein:
    said sensing element is disposed relative to an area defining said sensing plane only in areas where the PCB has some probability of deterioration due to high imposed electric fields.

5. The method of claim 1 wherein:
    said sensing plane is disposed under a top signal layer of the PCB.

6. The method of claim 1 wherein:
    said first and second comb arrays are each defined by a plurality of first and second branch traces, respectively, contiguous first branch traces having one second branch trace therebetween and contiguous second branch traces having one first branch trace therebetween.

7. The method of claim 6 wherein:
spacing between contiguous first and second branch traces is greater than about 0.003 inch.

8. A method for at least one of detecting and preventing burning of a PCB, the method comprising:
configuring a first comb array defined by a plurality of first fingers at a first potential;
configuring a second comb array defined by a plurality of second fingers at a second potential different from said first potential;
interlacing said plurality of first fingers defining said first comb array with said plurality of second fingers defining said second comb array embedded in a substrate;
disposing said substrate with the PCB; and
detecting a rise in leakage current between said first and second comb arrays indicative of a breakdown of said substrate,
wherein contiguous pairs of each interlaced first and second fingers have one of a BGA and a LGA conductive pad therebetween, each column of said one of the BGA and the LGA pads includes two separate branch traces at different potentials, each branch trace including a plurality of one of said first and second fingers extending therefrom.

9. An apparatus for at least one of detecting and preventing burning of a PCB comprising:
a first comb array defined by a plurality of first fingers at a first potential;
a second comb array defined by a plurality of second fingers at a second potential different from said first potential, said plurality of first fingers defining said first comb array interlaced with said plurality of second fingers defining said second comb array embedded in a substrate;
a PCB disposed with said substrate to detect a rise in leakage current between said first and second comb arrays indicative of a breakdown of said substrate,
wherein said first comb array is interlaced with said second comb array is coplanar and includes a layer of epoxy and fiberglass above and below a sensing element defined by said first and second comb arrays arranged in a sensing plane.

10. The apparatus of claim 9 wherein:
said substrate is an epoxy.

11. The apparatus of claim 9 wherein:
said sensing element is disposed relative to said sensing plane in a manner to maximize monitoring as much of an area defining the PCB as is possible.

12. The apparatus of claim 9 wherein:
said sensing element is disposed relative to an area defining said sensing plane only in areas where the PCB has some probability of deterioration due to high imposed electric fields.

13. The apparatus of claim 9 wherein:
said sensing plane is disposed under a top signal layer of the PCB.

14. The apparatus of claim 9 wherein:
said first and second comb arrays are each defined by a plurality of first and second branch traces, respectively, contiguous first branch traces having one second branch trace therebetween and contiguous second branch traces having one first branch trace therebetween.

15. The apparatus of claim 14 wherein:
spacing between contiguous first and second branch traces is greater than about 0.003 inch.

16. The apparatus of claim 9 wherein:
contiguous pairs of each interlaced first and second fingers have one of a BGA and a LGA conductive pad therebetween.

17. The apparatus of claim 16 wherein:
each column of said one of a BGA and a LGA pads includes two separate branch traces at different potentials, each branch trace including a plurality of one of said first and second fingers extending therefrom.

* * * * *